(12) United States Patent
Lee et al.

(10) Patent No.: US 10,510,560 B2
(45) Date of Patent: Dec. 17, 2019

(54) METHOD OF ENCAPSULATING A SUBSTRATE

(71) Applicants: Nanyang Technological University, Singapore (SG); Massachusetts Institute of Technology, Cambridge, MA (US)

(72) Inventors: Kwang Hong Lee, Singapore (SG); Eng Kian Kenneth Lee, Singapore (SG); Chuan Seng Tan, Singapore (SG); Eugene A. Fitzgerald, Cambridge, MA (US); Viet Cuong Nguyen, Singapore (SG)

(73) Assignees: Nanyang Technological University, Singapore (SG); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/754,123

(22) PCT Filed: Aug. 31, 2016

(86) PCT No.: PCT/SG2016/050423
§ 371 (c)(1),
(2) Date: Feb. 21, 2018

(87) PCT Pub. No.: WO2017/039542
PCT Pub. Date: Mar. 9, 2017

(65) Prior Publication Data
US 2018/0254197 A1 Sep. 6, 2018

Related U.S. Application Data

(60) Provisional application No. 62/283,648, filed on Sep. 4, 2015.

(51) Int. Cl.
*H01L 21/56* (2006.01)
*H01L 23/31* (2006.01)
(Continued)

(52) U.S. Cl.
CPC ........ *H01L 21/56* (2013.01); *H01L 21/02002* (2013.01); *H01L 21/28575* (2013.01);
(Continued)

(58) Field of Classification Search
CPC ......... H01L 21/02002; H01L 21/28575; H01L 21/56; H01L 21/8258; H01L 21/8238;
(Continued)

(56) References Cited

U.S. PATENT DOCUMENTS

2003/0224580 A1* 12/2003 Huang .............. H01L 21/76224
438/435
2006/0088994 A1 4/2006 Dao
(Continued)

FOREIGN PATENT DOCUMENTS

WO 2015108488 A1 7/2015
WO 2016007088 A1 1/2016

OTHER PUBLICATIONS

International Search Report for Application No. PCT/SG2016/050423 dated Dec. 5, 2016.
(Continued)

*Primary Examiner* — Hrayr A Sayadian
(74) *Attorney, Agent, or Firm* — Lerner, David, Littenberg, Krumholz & Mentlik, LLP

(57) ABSTRACT

A method of encapsulating a substrate is disclosed, in which the substrate has at least the following layers: a CMOS device layer, a layer of first semiconductor material different to silicon, and a layer of second semiconductor material, the layer of first semiconductor material arranged intermediate the CMOS device layer and the layer of second semicon-
(Continued)

ductor material. The method comprises: (i) circumferentially removing a portion of the substrate at the edges; and (ii) depositing a dielectric material on the substrate to replace the portion removed at step (i) for encapsulating at least the CMOS device layer and the layer of first semiconductor material. A related substrate is also disclosed.

19 Claims, 8 Drawing Sheets

(51) Int. Cl.
    *H01L 29/00* (2006.01)
    *H01L 21/02* (2006.01)
    *H01L 21/285* (2006.01)
    *H01L 21/762* (2006.01)
    *H01L 21/8238* (2006.01)
    *H01L 21/8258* (2006.01)

(52) U.S. Cl.
    CPC .... *H01L 21/76256* (2013.01); *H01L 21/8238* (2013.01); *H01L 23/3185* (2013.01); *H01L 29/00* (2013.01); *H01L 21/8258* (2013.01)

(58) Field of Classification Search
    CPC H01L 23/3185; H01L 29/00; H01L 21/76256
    USPC ......................................................... 257/347
    See application file for complete search history.

(56) References Cited

U.S. PATENT DOCUMENTS

| | | |
|---|---|---|
| 2006/0172505 A1 | 8/2006 | Koester et al. |
| 2007/0105256 A1 | 5/2007 | Fitzgerald |
| 2008/0020515 A1 | 1/2008 | White et al. |
| 2014/0113452 A1 | 4/2014 | Lin et al. |
| 2014/0307997 A1 | 10/2014 | Bar et al. |
| 2015/0008520 A1 | 1/2015 | Cheng et al. |
| 2015/0228669 A1 | 8/2015 | Czornomaz et al. |

OTHER PUBLICATIONS

Shearn et al., Advanced Plasma Processing: Etching, Deposition, and Wafer Bonding Techniques for Semiconductor Applications, Laboratory of Applied Physics, California Institute of Technology, 2010, pp. 79-104.

Ye et al., ALD High-k as a Common Gate Stack Solution for Nano-electronics, ECS Transactions, The Electrochemical Society, School of Electrical and Computer Engineering and Birck Nanotechnology Center, Purdue University, vol. 28, Issue 2, Apr. 2010, pp. 51-68.

Zhao et al., Direct integration of III-V compound semiconductor nanostructures on silicon by selective epitaxy, Device Research Laboratory, Electrical Engineering, University of California, Los Angeles, Dec. 16, 2008, pp. 1-6.

Chilukuri et al., "Monolithic CMOS-comparible AlGaInP visible LED arrays on silicon on lattice-engineered substrates (SOLES)", Institute of Physics Publishing, Semiconductor Science and Technology, 22, published Nov. 24, 2006, pp. 29-34.

Marcon et al., "Manufacturing Challenges of GaN-on-Si HEMTs on a 200 mm CMOS Fab", IEEE Transactions on Semiconductor Manufacturing, vol. 26, No. 3, Aug. 2013, pp. 361-367.

U.S. Appl. No. 62/021,810, filed Jul. 8, 2014.

Supplemental European Search Report for EP16842434 dated Oct. 17, 2018.

* cited by examiner

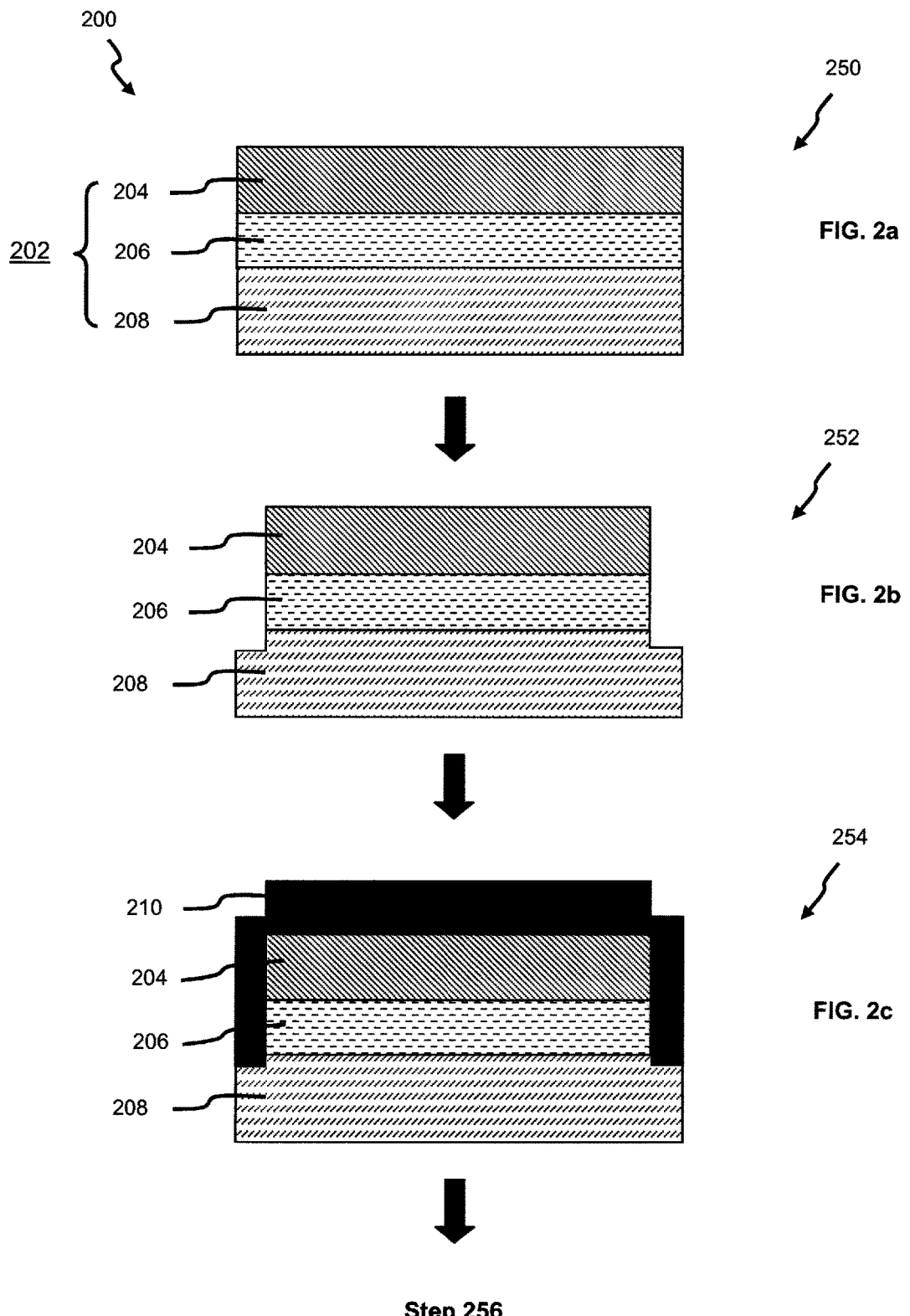

METHOD OF ENCAPSULATING A SUBSTRATE

CROSS REFERENCE TO RELATED APPLICATIONS

The present application is a national phase entry under 35 U.S.C. § 371 of International Application No. PCT/SG2016/050423 filed Aug. 31, 2016, published in English, which claims priority from U.S. Application Ser. No. 62/283,648 filed Sep. 4, 2015, all of which are incorporated herein by reference.

FIELD

The present invention relates to a method of encapsulating a substrate, and more specifically, it pertains to a method of encapsulating a substrate for CMOS-compatibility.

BACKGROUND

Silicon complementary metal-oxide-semiconductor (Si-CMOS) has dominated the semiconductor industry for the last five decades, leading to sustained and significant technological advancements in integrated circuits (ICs) and microelectronics, through application of Moore's Law scaling of CMOS transistor devices. However, the most advanced CMOS devices of today have shrunk to the point where they are only on the order of a few atoms in size, and are fast approaching a point where physics and economics will preclude further meaningful scaling. Thus, any future IC performance gains likely need to be achieved using different approaches, of which one of the most promising is to use new semiconductor materials to produce hybrid devices, such as compound semiconductors (e.g. III-V semiconductors and etc.), that have better electrical and optical properties than silicon. The most beneficial way to utilize the new materials is not to have them replace silicon entirely, but to adopt each material for manufacturing specific functional portions of an integrated circuit. For instance, the high integration density of Si-CMOS makes it ideal for producing functional portions intended for digital processing and logic applications, whereas various III-V materials are highly suitable for manufacturing functional portions intended for optoelectronic and RF/wireless applications, and high energy-storage density Li-based materials are optimal for producing integrated micro-batteries. The challenge therefore is to monolithically integrate the different types of materials such that the different functional portions of the circuits are able to work together seamlessly and efficiently, while occupying minimal chip footprint.

Practical monolithic integration requires different materials to be processed within CMOS circuits in commercial CMOS fabrication facilities, without compromising the standard CMOS manufacturing processes (i.e. no contamination). This is because, due to massive investment over the past decades, the CMOS industry and infrastructure are the most developed and advanced, compared with the equivalent for other types of electronic materials. As a result, this generally requires that non-CMOS materials, which are typically perceived as (and sometimes, in very specific situations, are considered real) CMOS contaminants, are never etched or exposed during processing by CMOS compatible tools.

In this regard, there is a recent report in literature on prevention of cross-contamination between CMOS and III-V materials, where the solution proposed is to selectively grow the III-V layers (of an LED) and then cap the III-V materials with a thin layer of silicon—see FIG. 1. The bottom contact of the LED is accessed through the 100% germanium (Ge) cap of a silicon-on-lattice-engineered substrate (SOLES) wafer 100, as shown in FIG. 1.

However, in cases where completed non-CMOS layers are displaced above or under the Si-CMOS layer(s), the non-CMOS materials (of the layers) may still potentially be exposed at the edges of the associated wafers, since the non-CMOS regions are not confined within oxide wells, similar to the case in the SOLES wafer 100.

One object of the present invention is therefore to address at least one of the problems of the prior art and/or to provide a choice that is useful in the art.

SUMMARY

According to a $1^{St}$ aspect, there is provided a method of encapsulating a substrate having at least the following layers: a CMOS device layer, a layer of first semiconductor material different to silicon, and a layer of second semiconductor material, the layer of first semiconductor material arranged intermediate the CMOS device layer and the layer of second semiconductor material. The method comprises: (i) circumferentially removing a portion of the substrate at the edges; and (ii) depositing a dielectric material on the substrate to replace the portion removed at step (i) for encapsulating at least the CMOS device layer and the layer of first semiconductor material.

Beneficially, the proposed method allows the CMOS device layer and the layer of first semiconductor material (being non-CMOS and different to silicon) of the substrate to be encapsulated, so that when the substrate is later returned to semiconductor foundries for backend processing, the layer of first semiconductor material will not be exposed to contaminate CMOS compatible tools in the foundries.

Preferably, the first semiconductor material may include a group III-V semiconductor material, or a material formed from combining different III-V semiconductor materials.

In particular, the group III-V semiconductor material may include GaN, InGaP, AlGaAs, InGaAsP, InGaN, AlGaN, GaAs, Ge, or InGaAs.

Preferably, the second semiconductor material may include silicon, or a CMOS-compatible material.

Preferably, the CMOS device layer may include silicon-on-insulator based devices.

Preferably, circumferentially removing the portion of the substrate may include using reactive-ion etching, or inductively coupled plasma reactive-ion etching for the removal.

Preferably, prior to step (i), the method may further comprise removably attaching a wafer mask on the CMOS device layer using kapton tape, if reactive-ion etching, or inductively coupled plasma reactive-ion etching is used.

Preferably, the wafer mask may be formed of silicon.

Preferably, circumferentially removing the portion of the substrate may include using edge trimming for the removal.

Preferably, depositing the dielectric material on the substrate may include depositing a layer of the dielectric material on a surface of the CMOS device layer which opposes the layer of first semiconductor material, and is substantially parallel to the horizontal axis of the substrate, the method may further include: (iii) planarizing the substrate to at least partially remove the layer of the dielectric material deposited on the surface of the CMOS device layer.

Preferably, planarizing the substrate may include using chemical mechanical polishing for the planarization.

Preferably, the dielectric material may be selected from the group consisting of aluminium oxide, aluminium nitride, silicon dioxide, silicon nitride, synthetic diamond and boron nitride.

Preferably, depositing the dielectric material on the substrate may include using plasma-enhanced chemical vapour deposition for the deposition.

Preferably, subsequent to step (iii), the method may further comprise: (iv) depositing the dielectric material on a surface of the layer of second semiconductor material which opposes the layer of first semiconductor material.

Preferably, subsequent to step (iii) or (iv), the method may yet further comprise: (v) annealing the substrate to densify the deposited dielectric material.

Preferably, circumferentially removing the portion of the substrate may include partially removing a portion of the edge of the layer of second semiconductor material.

Preferably, the method may further comprise maintaining attachment of the wafer mask on the CMOS device layer during performance of step (ii).

Preferably, the method may further comprise removing the wafer mask subsequent to step (i) and prior to step (ii); and depositing a spin-on glass material as the dielectric material on the substrate in step (ii).

According to a $2^{nd}$ aspect, there is provided a substrate comprising at least the following layers: a CMOS device layer, a layer of first semiconductor material different to silicon, and a layer of second semiconductor material, the layer of first semiconductor material being arranged intermediate the CMOS device layer and the layer of second semiconductor material. At least the CMOS device layer and the layer of first semiconductor material are arranged to be circumferentially encapsulated by a dielectric material.

Preferably, the first semiconductor material may include a group III-V semiconductor material, or a material formed from combining different III-V semiconductor materials.

Preferably, the second semiconductor material may include silicon, or a CMOS-compatible material.

Preferably, the CMOS device layer may include silicon-on-insulator based devices.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 2, which includes FIGS. 2a to 2e, is a method of encapsulating a substrate, according to an embodiment;

DETAILED DESCRIPTION OF PREFERRED EMBODIMENTS

Figure 1:
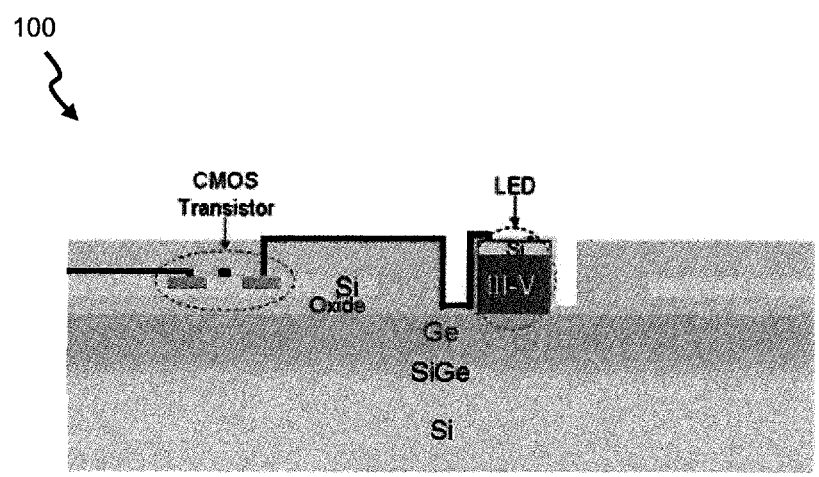
FIG. 1 shows schematics of monolithic integration achieved on a silicon-on-lattice-engineered substrate (SOLES) wafer, according to the prior art.
Figure 2D:
Figure 2E:
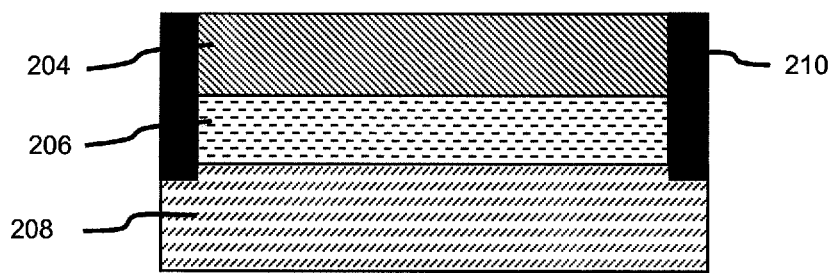

FIG. 2 shows a method 200 of encapsulating a substrate 202 for CMOS-compatibility, according to an embodiment. The substrate 202 has at least the following layers: a CMOS device layer 204, a layer of first semiconductor material 206 (which is different to silicon and non-CMOS compatible), and a layer of second semiconductor material 208. The layer of first semiconductor material 206 is arranged intermediate the CMOS device layer 204 and the layer of second semiconductor material 208. From a top-down perspective, the layers of the substrate 202 are arranged as: the CMOS device layer 204, the layer of first semiconductor material 206, and the layer of second semiconductor material 208 (residing at the bottom of the substrate 202).

The CMOS device layer 204 may include silicon-on-insulator (SOI) based devices. It is to be appreciated that in some instances, the CMOS device layer 204 (when provided at step 250 of the method 200) may already be pre-capped with a capping dielectric layer, e.g. formed of Borophosphosilicate glass (which is not shown in FIG. 2a), on its top surface to protect the CMOS device layer 204, but need not always be the case. The capping dielectric layer may also be of a same dielectric material to be used at step 254 (although not necessarily so always), depending on applications. Further, to clarify, the definition of CMOS device layer 204 refers to only the single-crystal Si portion of an SOI substrate. The bulk of the SOI substrate has been removed and replaced with the layer of second semiconductor material 208. It is to be noted that an SOI substrate is canonically a thin (i.e. from 10 nm to few μm) silicon single-crystal layer displaced over a "buried-oxide" (BOX) layer, which is further attached to a bulk silicon substrate (of hundreds of μm thick). So the CMOS device layer 204 is defined to include all the CMOS devices fabricated (on the SOI substrate), and part/all of the BOX layer, for avoidance of doubt. Then, the first semiconductor material includes a group III-V semiconductor material, or a material formed from combining different III-V semiconductor materials. Specifically, the group III-V semiconductor material includes GaN, InGaP, AlGaAs, InGaAsP, InGaN, AlGaN, GaAs, Ge, InGaAs, GaAs, InSb, AlSb, AlP, GaP, AlAs, GaAs, InP, InAs, GaAb, AlSb, InSb, GaN, InN, AlN or their compositions and etc. But this is not to be construed as limiting; indeed other non III-V materials (i.e. non-CMOS or different to silicon) are possible too—any other non-CMOS materials that may be deposited close to the CMOS device layer 204 may be used as the first semiconductor material. In certain instances, the layer of first semiconductor material 206 may also be provided in a completed device form, for example, as a high-electron-mobility transistor (HEMT).

On the other hand, the second semiconductor material includes silicon, or a CMOS-compatible material. Hence, (in certain embodiments) the substrate 202 can be in the form of an integrated patterned SOI-InGaAs/GaAs/Ge/Si substrate or a patterned SOI-GaN/Si substrate (and in either case, may collectively be referred to as an SOI-III-V/Si substrate). It is also to be appreciated that the specific structure of the substrate 202 and associated method of manufacturing the substrate 202 per se have already been disclosed in PCT publication number: WO 2016/007088, and so the interested reader may refer to the said PCT publication for more details on those aspects, if desired. The contents of PCT publication number, WO 2016/007088, are also incorporated by reference herein in their entirety. To briefly highlight, the substrate 202 (provided at step 250 herein) is equivalent to the final substrate 270 at FIG. 2e disclosed in WO 2016/007088, wherein the BOX layer 254 and the layer of dielectric material 262 in FIG. 2e of WO 2016/007088 are however not shown in substrate 202 of FIG. 2a herein for simplicity sake. For good order, it is also highlighted that the relative dimensions of the CMOS device layer 204, the layer of first semiconductor material 206, and the layer of second semiconductor material 208 depicted in FIG. 2 have been exaggerated simply for clarity of illustration, and are not to be construed as representative of the actual dimensions possible.

The method 200 starts by first providing the substrate 202 at step 250 (i.e. see FIG. 2a), and at next step 252 (i.e. see FIG. 2b), a portion of the substrate 202 is circumferentially removed at the edges. Particularly, in this instance, the amount of material for the circumferential edge of the CMOS device layer 204, and the layer of first semiconductor material 206 to be removed is kept as low as possible bearing in mind the need to consider process edge exclusions, which means a removal of about 3 mm to 7 mm of material from the original edge, while only a portion of the circumferential edge of the layer of second semiconductor material 208 is removed by the same thickness, as shown in FIG. 2b. This means that a section of the layer of second semiconductor material 208 processed at step 252 has a smaller circumference, compared to an adjoining section of the layer of second semiconductor material 208 not subjected to the circumferential removal process. The remaining portion of the layer of second semiconductor material 208 not removed at step 252 will then serve as a base to support a layer of dielectric material 210 to be deposited at next step 254—see below. It is also to be clarified that step 250 is an optional step of the method 200. In this regard, circumferentially removing the portion of the substrate 202 includes using reactive-ion etching (RIE), inductively coupled plasma (ICP) RIE, or edge trimming for the removal, as desired. Needless to say, removing a portion of the substrate 202 at the edges reduces the original circumferential size of at least the CMOS device layer 204, and the layer of first semiconductor material 206 to some extent. Also, if RIE or ICP-RIE is used, a wafer mask (not shown) is to be removably attached onto the top surface of the CMOS device layer 204 using kapton tape, prior to execution of step 252. The wafer mask used is to be of a slightly smaller diameter (e.g. 190 mm), and is formed of silicon. The wafer mask protects the top surface of the CMOS device layer 204, when etching is being performed, but is removed when etching is completed.

At further step 254 (i.e. see FIG. 2c), a layer of dielectric material 210 is deposited (e.g. using plasma-enhanced chemical vapour deposition (PECVD), other suitable CVD techniques, or sputtering techniques) on the substrate 202 in order to replace the portion removed at step 252 for encapsulating at least the CMOS device layer 204 and the layer of first semiconductor material 206. A thickness of the dielectric material 210 to be deposited depends on requirements of applications intended, and can flexibly be deposited as larger/smaller than a thickness of the portion of the substrate 202 removed at step 252. If the originally-present thickness of the capping dielectric layer (if provided) on the CMOS device layer 204 is to be preserved, then a larger thickness of the dielectric material 210 needs to be deposited, since some of the dielectric material 210 may be lost during planarization. On the other hand, because the originally present capping dielectric layer (if provided) can in some cases be arranged to take the planarization-related "loss" into account, a smaller amount of the dielectric material 210 may also be deposited. Hence, there is some flexibility in terms of how much of the dielectric material 210 to be deposited at step 254. This thus restores the substrate 202 back to its original size, circumferentially speaking. During the process, the top surface of the CMOS device layer 204 is also deposited with its own layer of the dielectric material 210 as well. The dielectric material 210 may (for example) be aluminium oxide ($Al_2O_3$), aluminium nitride (AlN), silicon dioxide ($SiO_2$), silicon nitride (SiN), synthetic diamond or boron nitride (BN). Then at step 256 (i.e. see FIG. 2d), the substrate 202 is planarized (e.g. using chemical mechanical polishing (CMP)) to at least partially remove the dielectric material 210 deposited on the top surface of the CMOS device layer 204, when step 254 is carried out. More specifically, this is to expose the top surface of the CMOS device layer 204—in this case, the top surface can be defined as a surface of the CMOS device layer 204 which opposes the layer of first semiconductor material 206, and is substantially parallel to the horizontal axis of the substrate 202.

At optional step 258 (i.e. see FIG. 2e), the dielectric material 210 is also deposited on the back surface of the layer of second semiconductor material 208, which opposes the layer of first semiconductor material 206. Step 258 may also be termed as the "back-side" treatment, and is done to ensure compatibility of the substrate 202 (subsequent to processing at step 258) with certain CMOS process flows, which may require a layer of backside dielectric to be present. Moreover, after step 256 or 258, the substrate 202 may be annealed to densify the dielectric material 210 deposited on the substrate 202 in order to improve the resistance to wet-chemical etching that may be performed in subsequent processes.

Figure 3:
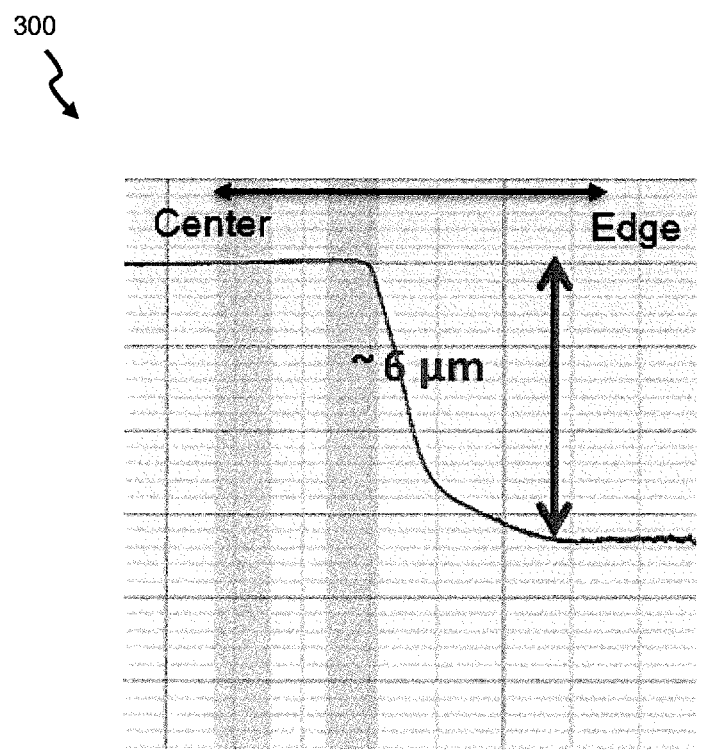
FIG. 3 shows a measurement result relating to the profile around the edge of the substrate of FIG. 2, after being subjected to reactive-ion etching, or inductively coupled plasma reactive-ion etching.

FIG. 3 shows a measurement result 300 relating to the profile around the edge of the substrate 202, after being subjected to RIE, or ICP-RIE at step 252. As shown, a vertical depth of about 6 µm of material was etched (collectively from the CMOS device layer 204, the layer of first semiconductor material 206 and the layer of second semiconductor material 208) at the edge of the substrate 202 in this embodiment. It is to be appreciated that a thickness of the substrate 202 used in the experiment for obtaining the measurement result 300 is about 730 µm, but certainly not limiting on application of the method 200 in any manner. Accordingly, approximately 6 µm of the dielectric material 210 is then to be deposited on the substrate 202 (at step 254) as replacement, as afore described.

Figure 4:
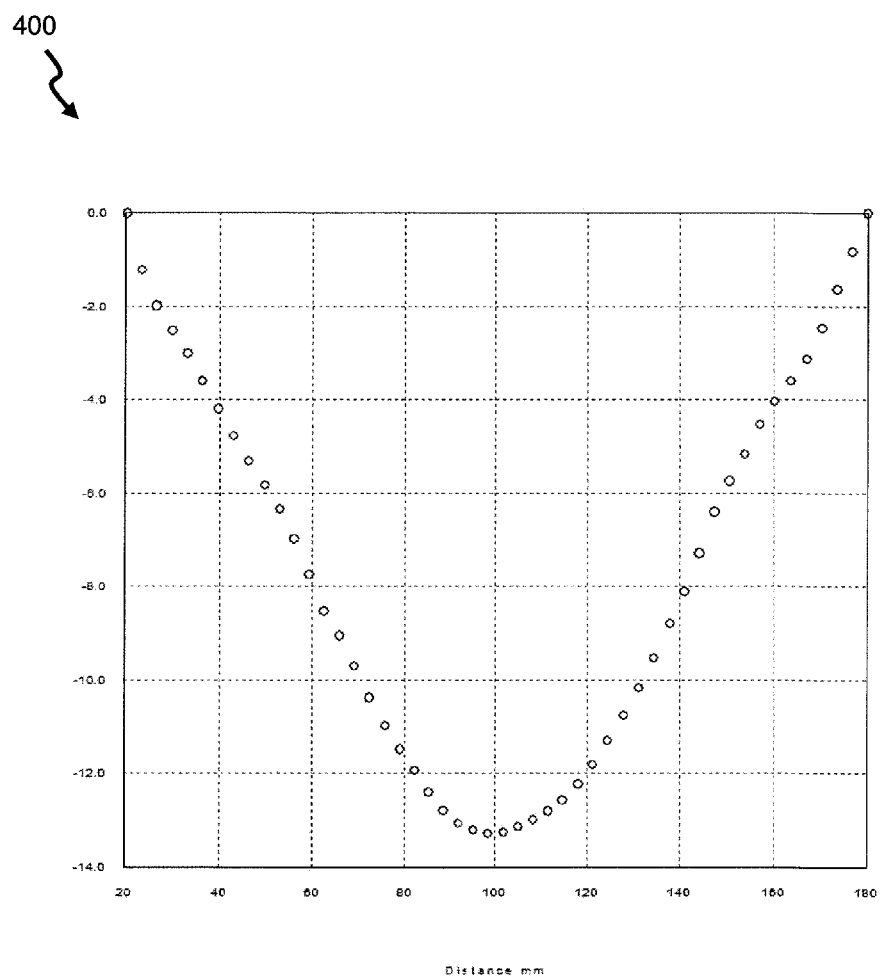
FIG. 4 shows a measurement result relating to the bow profile of the substrate of FIG. 2, subsequent to deposition of a layer of dielectric material.
Figures 5A, 5B:
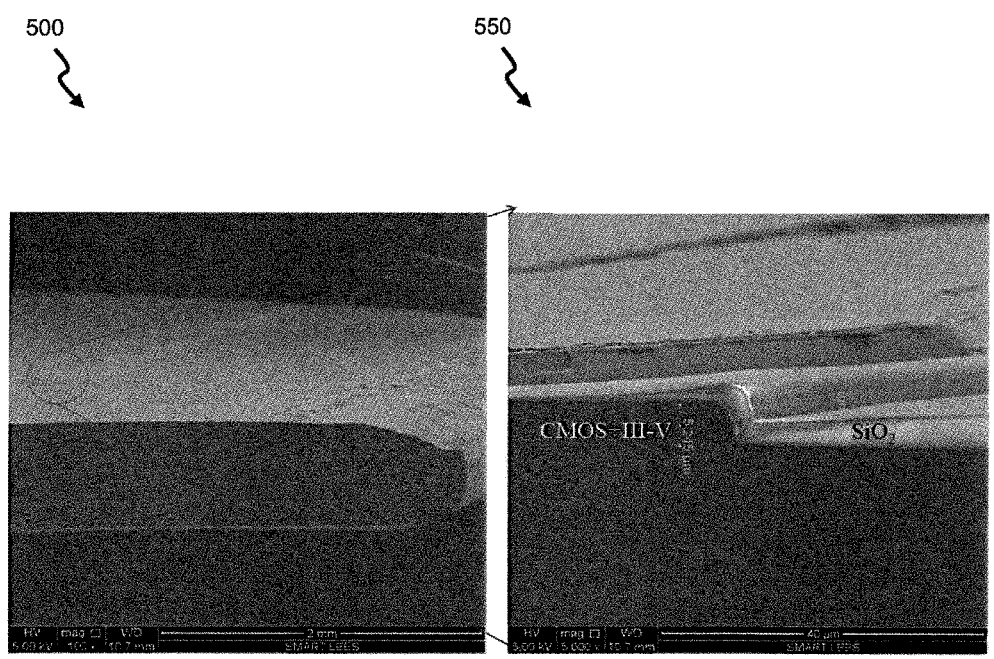
FIGS. 5a and 5b show respective magnified views relating to the profile around the edge of the substrate of FIG. 2, after being subjected to chemical mechanical polishing (CMP)
Figure 6:
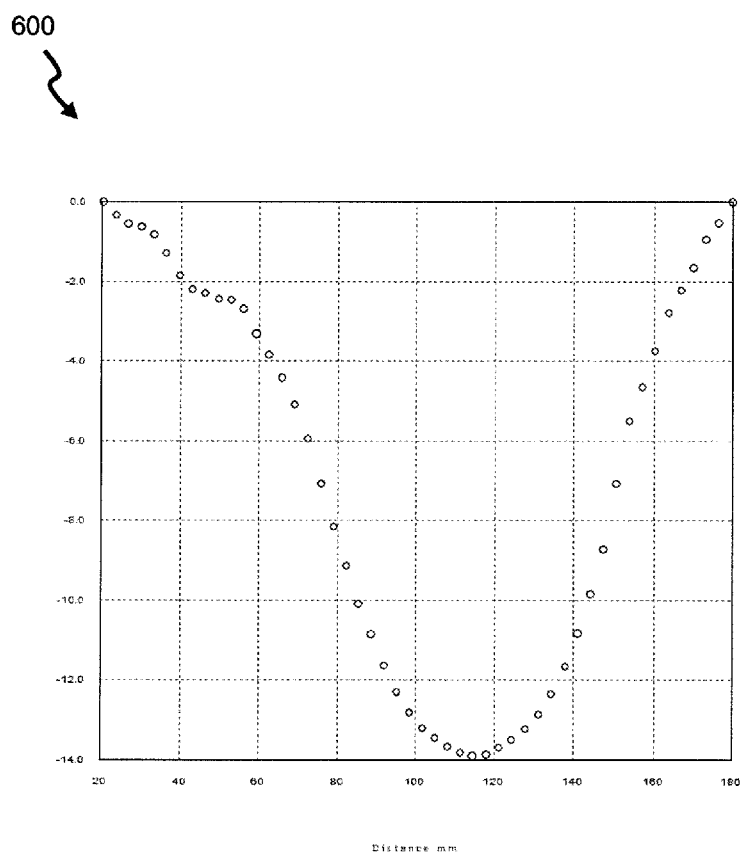
FIG. 6 shows a measurement result relating to the bow profile of the substrate of FIG. 2, after being subjected to chemical mechanical polishing (CMP)

FIG. 4 shows a measurement result 400 relating to the bow profile of the substrate 202, subsequent to depositing the dielectric material 210 at step 254. As measured, the bow of the (processed) substrate 202 is about 14 µm depicted in FIG. 4. As afore described, to planarize the substrate 202 at step 256, CMP may be used, and in this case, the CMP recipe is tuned for removing more materials at the centre of the substrate 202 (in relation to the CMOS device layer 204) than at the edges of the substrate 202. After performing CMP, the step profile obtained around the edge of the substrate 202 is shown in respective magnified diagrammatic views 500, 550 of FIGS. 5a and 5b. It can be observed from FIG. 5b that there is a dip at a location where the edge of the wafer mask is, the likely reason being that there might be a higher etch rate around this region. By using spin on glass (SOG), the problem can be addressed due to its better filling capability. In addition, the bow profile of the substrate 202, after subjected to CMP is shown in the measurement result 600 of FIG. 6. From FIG. 6, it is determined that the substrate 202 does not change much from 14 μm (as previously measured in the result 400 of FIG. 4), which is considered an acceptable figure for all processing tools of subsequent processes.

Figures 7A, 7B:
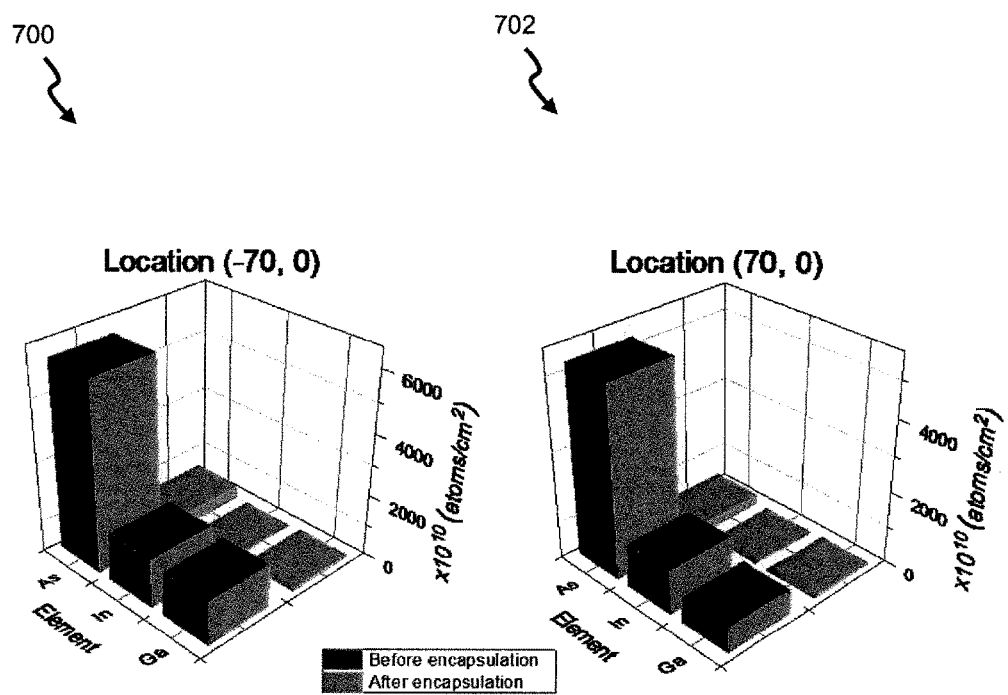
FIGS. 7a and 7b show respective graphs depicting gallium (Ga), indium (In) and arsenic (As) contaminations measured at two selected locations of a SOI-III-V/Si substrate, before and after the substrate is encapsulated using the method of FIG. 2.

Total Reflection X-ray Fluorescence (TXRF) spectroscopy is used to measure a level of III-V materials contaminations on the substrate 202 before and after encapsulation using the proposed method 200. In this regard, FIGS. 7a and 7b show respective graphs 700, 702 depicting gallium (Ga), indium (In) and arsenic (As) contaminations measured at two different locations of the substrate 202, before and after processing via the method 200. As depicted in 7a and 7b, the III-V materials contaminations are reduced by two-orders of magnitude to between about $10^{10}$ to $10^{11}$ atoms/cm² after performing the encapsulation. Separately, some pin-holes and un-bonded areas are also observed on the processed substrate 202, which may explain the higher contamination observed. By addressing these problems (i.e. the pin-holes and un-bonded areas) correctly, it is envisaged that the contaminations by III-V materials can further be lowered. According to the IMEC specification, the desired contamination levels should ideally be lower than $10^{11}$ atoms/cm², and on this, it is believed the said criteria is attainable using the proposed method 200 for processing.

As above mentioned, PCT publication number: WO 2016/007088 discloses allowing for CMOS and non-CMOS materials (e.g. Si-CMOS and III-V materials respectively), to be processed separately and then combined together to form an integrated substrate using a double layer transfer (DLT) process. This however only partially solves the problem (related to integrating CMOS and non-CMOS materials in a device), as the integrated substrate still needs to be returned to semiconductor foundries for backend processing (e.g. to connect the Si-CMOS and HEMT together). During the backend processing, III-V materials from the edge of the integrated wafer may still be exposed to CMOS compatible tools in the foundries resulting in contamination, which is undesirable. Hence, additional protection is required on the edge of the integrated substrate to prevent the cross-contamination issue, which is advantageously solved by the proposed method 200. Particularly, the proposed method 200 includes edge etching/trimming a portion of the edge of the integrated substrate (e.g. about 5-7 mm from the edge), and thereafter, depositing the layer of dielectric material 210 to replace the etched edge portion and then followed by performing CMP on the integrated substrate for planarization. Optionally, the back-side treatment may also then be carried out on the processed integrated substrate, if necessary.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, at step 252, all necessary circumferential edge of the layer of second semiconductor material 208 is removed (in accordance with the corresponding edge portion removed for the CMOS device layer 204, and the layer of first semiconductor material 206), and not just only a portion of it. Also, the dielectric material 210 deposited on the back surface of the layer of second semiconductor material 208 at step 258 may be a different type of dielectric material from that used in step 254. Further, step 256 is not always required, depending on circumstances, and so step 256 is therefore optional to the proposed method 200. In addition, it is to be appreciated that the layer of first semiconductor material 206 may, in variant embodiments, be replaced by a plurality of III-V or other semiconductor layers (which are non-CMOS compatible). Alternatively, it may be that additional layers of different semiconductor materials (that are non-CMOS compatible) can also be arranged together with (on top/below) the layer of first semiconductor material 206, but still sandwiched between the CMOS device layer 204 and the layer of second semiconductor material 208. In such a case, all those additional layers are also to be encapsulated with the dielectric material 210 at step 254, together with the layer of first semiconductor material 206.

Further, at step 252, selective etching may alternatively be adopted to circumferentially etch away the layer of first semiconductor material 206 at the edges, which also needs corresponding cooperative optimization of step 254 to ensure complete encapsulation to be carried out subsequently.

Moreover, the wafer mask removably attached onto the top surface of the CMOS device layer 204, prior to execution of step 252 (if RIE or ICP-RIE is used), may be maintained on the CMOS device layer during performance of step 254, so that the dielectric material 210 will not be deposited on the top surface of the CMOS device layer 204 during the deposition process. Thereafter, the wafer mask can then be removed, once step 254 is completed. It is to be appreciated that planarization may or may not be required for this approach, depending on requirements.

Yet further, in another variation, the wafer mask removably attached onto the top surface of the CMOS device layer 204, prior to execution of step 252 (if RIE or ICP-RIE is used), may be removed subsequent to completing step 252 and prior to executing step 254; and then for step 254, a spin-on glass (SOG) material is deposited as the dielectric material 210 on the substrate 202 at step 254. It is to be appreciated that planarization may or may not be required for this approach, depending on requirements.

The invention claimed is:

1. A method of encapsulating a substrate having at least the following layers: a CMOS device layer, a layer of first semiconductor material different to silicon, and a layer of second semiconductor material, wherein the first semiconductor material is a group III-V semiconductor material or a material formed from combining different III-V semiconductor materials, and wherein the layer of first semiconductor material is arranged intermediate the CMOS device layer and the layer of second semiconductor material such that adjoining edges of the layer of first semiconductor material, the CMOS device layer and the layer of second semiconductor material define a circumferential edge of the substrate, the method comprising:

(i) removing a portion of the circumferential edge, wherein the portion removed comprises a portion of the CMOS device layer and a portion of the layer of first semiconductor material; and (ii) depositing a dielectric material on the substrate to replace the portion removed at step (i) for encapsulating at least the CMOS device layer and the layer of first semiconductor material such that the layer of first semiconductor material is unexposed.

2. The method of claim 1, wherein the group III-V semiconductor material includes GaN, InGaP, AlGaAs, InGaAsP, InGaN, AlGaN, GaAs, Ge, or InGaAs.

3. The method of claim 1, wherein the CMOS device layer includes silicon-on-insulator based devices.

4. The method of claim 1, wherein removing the portion of the circumferential edge includes using reactive-ion etching, or inductively coupled plasma reactive-ion etching for the removal.

5. The method of claim 4, wherein prior to step (i), the method further comprises:
removably attaching a wafer mask on the CMOS device layer using kapton tape.

6. The method of claim 5, wherein the wafer mask is formed of silicon.

7. The method of claim 1, wherein circumferentially removing the portion of the substrate includes using edge trimming for the removal.

8. The method of claim 1, wherein depositing the dielectric material on the substrate includes depositing a layer of the dielectric material on a surface of the CMOS device layer which opposes the layer of first semiconductor material, and is substantially parallel to the horizontal axis of the substrate, further includes:
(iii) planarizing the substrate to at least partially remove the layer of the dielectric material deposited on the surface of the CMOS device layer.

9. The method of claim 8, wherein planarizing the substrate includes using chemical mechanical polishing for the planarization.

10. The method of claim 1, wherein the dielectric material is selected from the group consisting of aluminium oxide, aluminium nitride, silicon dioxide, silicon nitride, synthetic diamond and boron nitride.

11. The method of claim 1, wherein depositing the dielectric material on the substrate includes using plasma-enhanced chemical vapour deposition for the deposition.

12. The method of claim 8, wherein subsequent to step (iii), further comprises at least one of:
(iv) depositing the dielectric material on a surface of the layer of second semiconductor material which opposes the layer of first semiconductor material; and
(v) annealing the substrate to densify the deposited dielectric material.

13. The method of claim 1, wherein removing the portion of the circumferential edge includes partially removing a portion of the edge of the layer of second semiconductor material.

14. The method of claim 5, further comprises:
maintaining attachment of the wafer mask on the CMOS device layer during performance of step (ii).

15. The method of claim 5, further comprises:
removing the wafer mask subsequent to step (i) and prior to step (ii); and
depositing a spin-on glass material as the dielectric material on the substrate in step (ii).

16. A substrate comprising at least the following layers:
a CMOS device layer,
a layer of first semiconductor material different to silicon,
a layer of second semiconductor material, wherein the first semiconductor material is a group III-V semiconductor material or a material formed from combining different group III-V semiconductor materials, and wherein the layer of first semiconductor material is arranged intermediate the CMOS device layer and the layer of second semiconductor material such that adjoining edges of the layer of first semiconductor material, the CMOS device layer and the layer of second semiconductor material define a circumferential edge of the substrate, wherein a portion of the circumferential edge has been removed, the portion removed comprising a portion of the CMOS device layer and a portion of the layer of first semiconductor material, and
a dielectric material deposited on the substrate to replace the portion removed, wherein the dielectric material encapsulates at least the CMOS device layer and the layer of first semiconductor material such that the layer of first semiconductor material is unexposed.

17. The substrate of claim 16, wherein the second semiconductor material includes silicon, or a CMOS-compatible material.

18. The substrate of claim 16, wherein the CMOS device layer includes silicon-on-insulator based devices.

19. The substrate of claim 16, wherein the dielectric material includes a layer of dielectric material deposited on a surface of the CMOS device layer which opposes the layer of first semiconductor material, and is substantially parallel to the horizontal axis of the substrate, and wherein the layer of dielectric material is at least partially removed by planarizing the substrate.

* * * * *